United States Patent [19]

Thurston

[11] Patent Number: 5,668,552
[45] Date of Patent: Sep. 16, 1997

[54] ANALOGUE-TO-DIGITAL CONVERTERS

[75] Inventor: Andrew Mark Thurston, Chelmsford, United Kingdom

[73] Assignee: GEC-Marconi Limited, Middlesex, United Kingdom

[21] Appl. No.: 313,316

[22] PCT Filed: Apr. 6, 1993

[86] PCT No.: PCT/GB93/00727

§ 371 Date: Dec. 28, 1994

§ 102(e) Date: Dec. 28, 1994

[87] PCT Pub. No.: WO93/21691

PCT Pub. Date: Oct. 28, 1993

[30] Foreign Application Priority Data

Apr. 8, 1992 [GB] United Kingdom ............... 9207626

[51] Int. Cl.$^6$ ........................................ H03M 3/02
[52] U.S. Cl. ........................................ 341/143; 341/155
[58] Field of Search ........................ 341/143, 155; 375/247, 249

[56] References Cited

U.S. PATENT DOCUMENTS

| | | | |
|---|---|---|---|
| 4,857,928 | 8/1989 | Gailus et al. | 341/143 |
| 5,027,120 | 6/1991 | Thurston | 341/143 |
| 5,311,181 | 5/1994 | Ferguson, Jr. et al. | 341/143 |
| 5,392,039 | 2/1995 | Thurston | 341/143 |

FOREIGN PATENT DOCUMENTS

| | | |
|---|---|---|
| 0 399 738 | 5/1990 | European Pat. Off. . |
| 2256331 | 5/1992 | United Kingdom . |

OTHER PUBLICATIONS

Dressler, H.-J. "Interpolative Bandpass A/D Conversion--Experimental Results", *Electronics Letters*, vol. 26, No. 20, Sep. 27, 1990.

*Primary Examiner*—Marc S. Hoff
*Attorney, Agent, or Firm*—Spencer & Frank

[57] ABSTRACT

An analog-to-digital converter includes an input for analog signals, a quantizer for producing a digital signal output, a feedback loop for feeding a signal derived from the digital output to be combined in analog form with the analog input for input to a filter. The output of the filter is fed to the quantizer. The filter comprises at least three filter stages. The filtered signal is derived using the output of at least one stage, other than the first stage, which is representative only of the response of the corresponding filter order and not of other filter orders. The output of the third stage is representative only of the third order response. A limiter is provided in the output of the third stage of the filter.

6 Claims, 3 Drawing Sheets

ANALOGUE-TO-DIGITAL CONVERTERS

BACKGROUND OF THE INVENTION

This invention relates to analogue-to-digital converters, and especially to sigma-delta analogue-to-digital converters.

Sigma-delta analogue-to-digital converters include quantising means for producing a digital output, oversampled relative to the signal bandwidth, and a feedback path for feeding a signal derived from the digital output to be combined in analogue form with the analogue input for input to filter means, the output of the filter means being applied to the quantising means. This permits improved signal-to-noise ratio to be achieved from coarse quantisation by shaping the quantisation noise spectrum to suppress it within a desired bandwidth.

The extent to which the quantising noise is shaped in the signal passband depends upon the order of the loop filter within the sigma-delta analogue-to-digital converter, the depth of the null in the quantising noise increasing as the order of the loop filter increases. Thus, referring to FIG. 1, a third order bandpass sigma-delta analogue-to-digital converter is theoretically possible. An analogue input 1 is combined at summing node 2 with an analogue version, due to digital-to-analogue converter 3, of the digital output 5, which is fed back along a negative feedback path 6, to produce a difference signal in the form of a current which flows in the first stage 7 of the filter means. Each stage 7, 8, 9 the filter means consists of a resonant circuit (inductor and capacitor in parallel) connected to a series resistor. The resulting voltage appears at the input of voltage-to-current converter buffer amplifier 10 producing a current at its output which flows in the second stage 8 of the filter, likewise producing a voltage input to a voltage-to-current converter buffer amplifier 11. Similarly, an output current flows in the third stage 9 of the filter means which causes a voltage to be applied to the voltage-to-current converter buffer amplifier 12, the output current of which develops across a resistor (not shown) a voltage at the input of quantising means 13.

The voltage across the third stage 9 of the filter means in response to an input analogue current depends upon the voltage across the second stage 8 of the filter means which in turn depends upon the voltage across the first stage 7. The response of each stage can perhaps best be understood by considering the effect of a pulse input current at summing node 2, imagining the forward path to be broken just before quantising means 13.

Referring to FIG. 2, the output voltage of the first filter stage 7 in response to a pulse input at the analogue input 1 can be considered to be formed of two parts, namely, 7a, a pulse voltage due to the resistor and a voltage 7b, which rises over the width of the pulse and then continues sinusoidally with approximately constant amplitude (actually slowly exponentially decaying).

The resulting voltage across the second stage of the filter means can be considered as being made up of four components 8a–8d. The voltage pulse 7a causes a voltage pulse 8a across the resistor and a rising and thereafter sinusoidal response 8b across the resonant circuit (like voltage 7b for the first stage). The voltage 7b causes a similar voltage 8c across the resistor, but a sinusoidal voltage across the resonant circuit which has a linearly increasing amplitude 8d.

The resulting voltage across the third stage 9 of the filter can be considered as formed of the components 9a–9f. The pulse voltage 8a causes a similar pulse voltage 9a across the resistor and a rising and thereafter sinusoidal voltage 9b (like 7b) across the resonant circuit. The voltages 8b, 8c are of the same form, and their combined effect is to produce a similar voltage 9c across the resistor, and a sinusoidal voltage having linearly increasing amplitude 9d (like 8d) across the resonant circuit. The voltage 8d produces a similar voltage 9e across the resistor and a sinusoid 9f having an amplitude increasing according to a square law across the resonant circuit.

The response of the filter means to a step input hence consists of six components (or eight if 8a, b are considered separately). However, there are four components only when voltages of similar form are considered as one component, namely, a first order response 9b, 9c consisting of a rising portion followed by sinusoidal portion of approximately constant amplitude, a second order response 9d, 9e consisting of a rising portion of shallower slope and sinusoidal portion of linearly increasing amplitude, a third order response 9f consisting of a rising portion of shallower slope and a sinusoidal portion, the amplitude of which increases according to a square law, and a zeroth order response formed by the pulse response 9a.

To obtain a desired response of the filter means of FIG. 1, the values of the resistors, relative values of the inductor and capacitor of each resonant circuit (the product of the values must be such as to produce the desired resonant frequency), and the amplifications of the buffer amplifiers must be selected accordingly. It is in fact very difficult to make such a converter work except over restricted ranges of operation. The Applicants themselves encountered these difficulties in attempting to design a second order bandpass sigma-delta analogue-to-digital converter (FIG. 4 of EP-A-O 399 738).

In one proposal concerning a second order bandpass sigma-delta converter (Electronics Letters, vol. 26, no. 20, 27 September 1990, pages 1652–3, H.-J. Dressler "Interpolative Bandpass A/D Conversion—Experimental Results"), these difficulties have been to some extent alleviated. The filter means of the sigma-delta converter comprises two stages, and the filtered signal which is fed to the quantising means of the analogue-to-digital converter, is derived using the output of the second stage which is representative only of the response of the second filter order and not of other filter orders. This output is combined with the output of the first stage of the filter (which is fed along a separate signal path) to produce the said filtered signal.

Whilst this concept in theory may be extended to three filter stages, so that the output of the third stage is representative only of the third order response, or more than three filter stages, and whilst a larger number of filter stages is desirable in any case from the point of view of suppressing quantising noise in the passband of the analogue-to-digital converter, a problem arises. This is that phase shifts across each stage combine so that negative feedback via the feedback loop can become positive feedback. Then, in the event of overload, the analogue-to-digital converter could fail to recover.

SUMMARY OF THE INVENTION

According to the invention, there are at least three filter stages, the output of the third stage being representative only of the third order response, and a limiter is provided in the output of the third stage of the filter, and any higher stages of the filter.

When the analogue input is not too large, the analogue-to-digital converter has the advantageous noise suppression arising from the use of three or more filter stages, together with the simplified choice of components arising from the use in the filtered signal of the output of a third filter stage which is representative only of the response of that filter order. However, when the analogue input overloads and becomes too large, recovery is promoted since the limiter restricts the output of the third order filter stage.

It may be found convenient for each stage to have a response representative only of its corresponding order. Or some order e.g. the second, may include a series resistor in order to combine directly the responses of that order and of that corresponding to the previous stage.

BRIEF DESCRIPTION OF THE DRAWINGS

A further stage may be provided and the output amplitude of that stage, preferably representative only of the fourth order, may also be limited.

Sigma-delta analogue-to-digital converters constructed in accordance with the invention will now be described, by way of example, with reference to the accompanying drawings, in which:

FIG. 3a shows a modified form for the buffer amplifiers of FIG. 3;

FIG. 3b shows an alternative version of the modification of FIG. 3a;

DETAILED DESCRIPTION OF THE INVENTION

Figure 1:
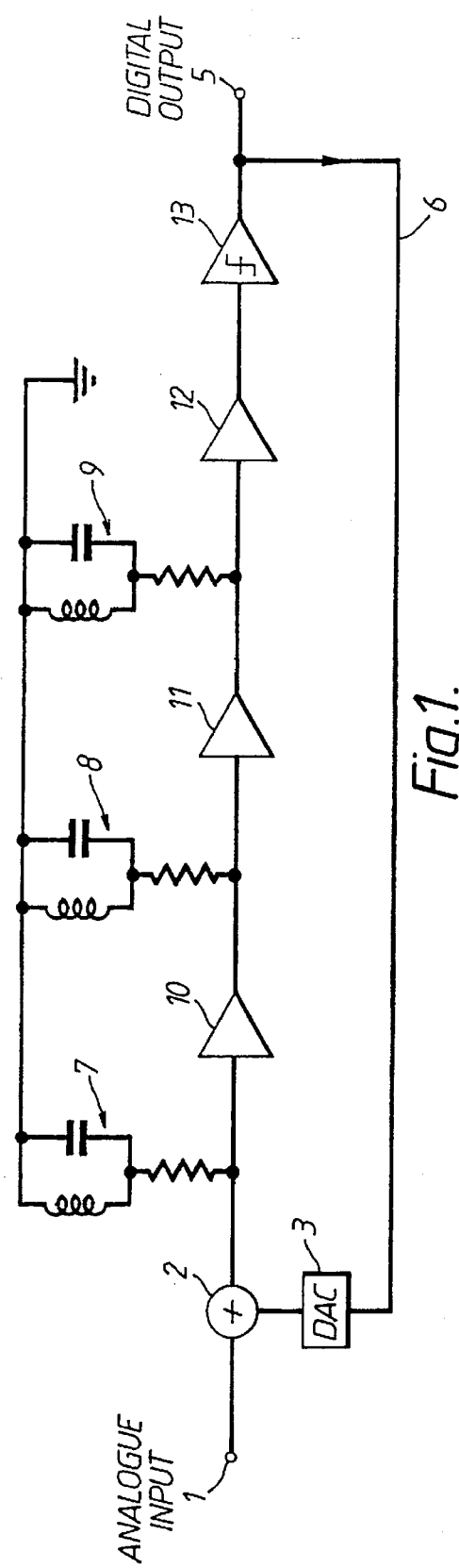
FIG. 1 is a schematic circuit diagram of a third order analogue-to-digital converter according to the prior art.

Like reference numerals have been given to like parts throughout the drawings.

Figure 3:
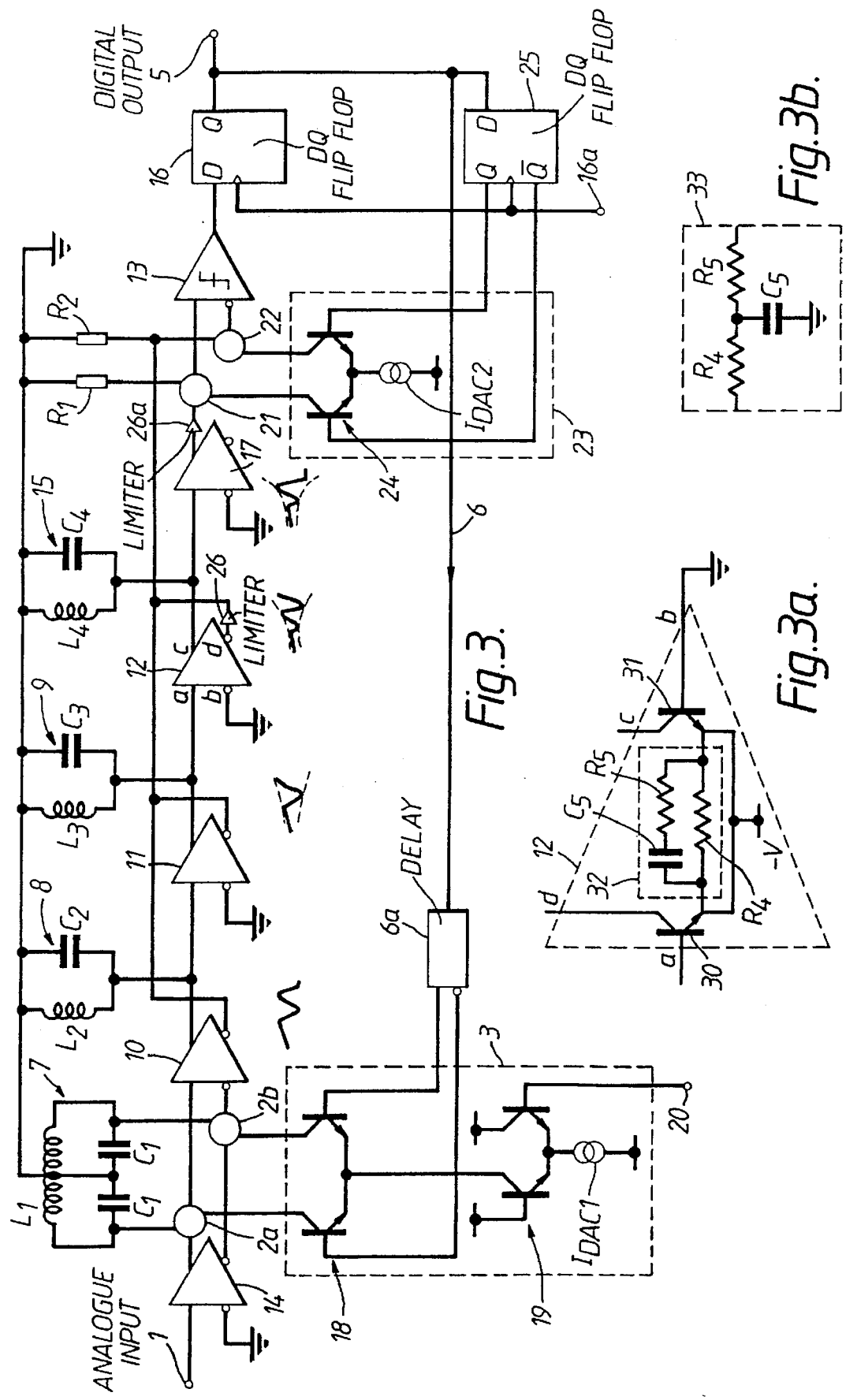
FIG. 3 is a schematic circuit diagram of a fourth order analogue-to-digital converter.

Referring to FIG. 3, an analogue input 1 is applied to voltage-to-current converter buffer amplifier 14, the differential output currents of which are combined at summing nodes 2a, 2b with the digital output of the converter 5 fed along feedback path 6 and convened to analogue form in digital-to-analogue converter 3. The delay 6a ensures that the feedback is negative, so that the summing nodes 2a, 2b pass difference signals to the four stages 7, 8, 9, 15 of the filter means of the analogue-to-digital converter. The filtered difference signal is applied to quantising means 13, the output of which is connected to DQ flip-flop 16 which is docked by means of clock 16a.

The four stages of the filter means are separated by voltage-to-current converter buffer amplifiers 10–12 and 17.

It will be noted that the digital output is divided into inverted and non-inverted components at delay 6a to produce inverted and non-inverted analogue feedback pulses, corresponding to the digital output. These pulses are produced by a long-tailed pair 18 driven at the bases by the outputs of the delay 6a and fed from a current source $I_{DAC1}$, itself part of long-tailed pair 19 driven by a clock input 20, which runs at the same rate as clock 16a.

The first stage of the filter means is in balanced form and consists of a centre tapped inductor L1 connected to the centre terminal of a pair of capacitors C1 and C1' which connect to the ends of the inductor, which points are fed with the inverted and non-inverted difference signals from the adders 2a, 2b.

In accordance with the invention the input of the quantising means 13 consisting of inverting and non-inverting currents from current adders 21, 22 does not only come from the output of the final filter stage, as in the arrangement illustrated in FIG. 1, but rather comes from outputs of more than one (in this case, all) of the buffer amplifiers 10–12 and 17 summed together, the output of at least one (in this case, all) filter stage(s) beyond the first being representative only of their respective orders. The first filter stage, having no series resistor, will also of course be representative only of the first order response.

Thus, none of the filter stages having resistors, the first order response of the filter means appears as inverted and non-inverted current outputs of buffer amplifier 10. Inverting and non-inverting voltages are applied to the input of the buffer amplifier as a result of the difference currents from the adders 2a, 2b flowing in the first resonant circuit L1, C1, C1'.

This first order response is applied directly to the quantising means 13 via summing node 22, as well as exciting the second stage of the filter means L2, C2 the voltage from which causes the second order response of the filter means to appear in the output of buffer amplifier 11.

The inverting output of the buffer amplifier 11 is passed directly to the input of the quantising means 13 while the non-inverting input excites the third stage of the filter means L3, C3 which produces the third order response in the output of the buffer amplifier 12.

The inverting output of the buffer amplifier 12 is passed directly to the quantising means 13 via the summing node 22 while the non-inverting input excites the fourth order of the filter means L4, C4, the voltage from which produces the fourth order response of the filter means in the output of the buffer amplifier 17. The non-inverting output of buffer amplifier 17 passes via summing node 21 to the non-inverting input of the quantising means 13.

It will be noted that, due to the absence of resistors, each stage of the filter means produces only the response corresponding to that stage e.g. the buffer amplifier-10 produces only a first order response, the buffer amplifier 11 produces only a second order response, the buffer amplifier 12 produces only a third order response and the buffer amplifier 17 produces only a fourth order response. Thus, if the quantising means 13 was connected to the output of the buffer amplifier 17 only, the quantising means 13 would simply receive the fourth order response of the filter means and not the other three orders.

It will be noted that at the output of the third stage of the filter, there are just three terms to be summed for input to the quantising mean. 13. This is to be contrasted with the seven terms which have to be summed at the quantising means in the embodiment described in FIG. 1, ignoring the pulse-form zeroth order of the filter. Accordingly the design of the filter is greatly simplified.

Figure 2:
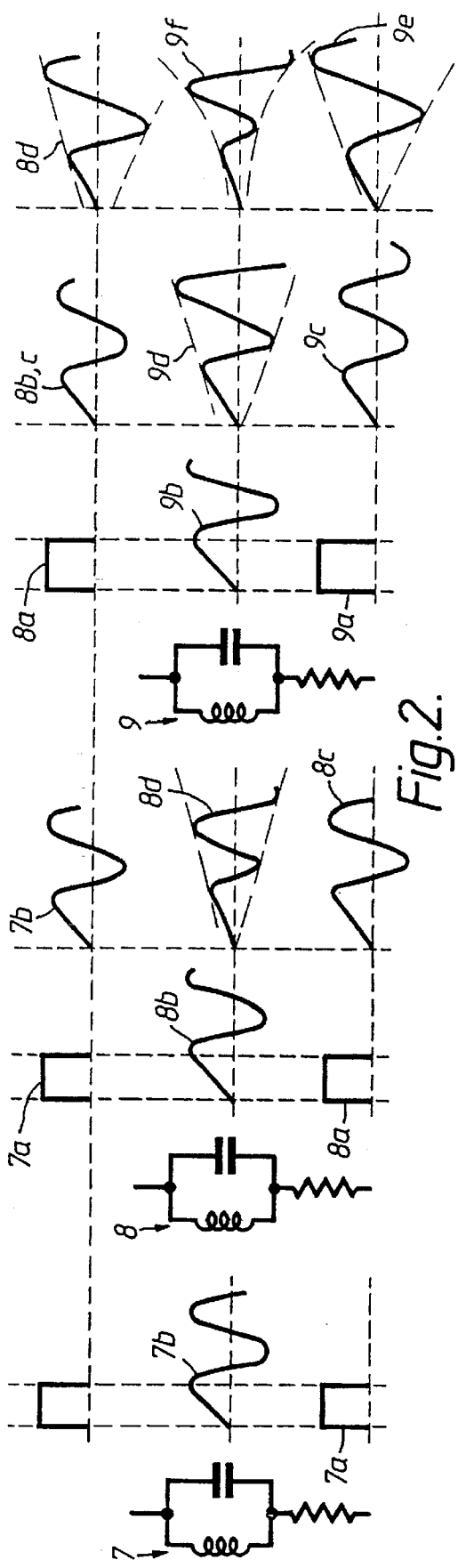
FIG. 2 is a signal diagram for explaining the operation of the circuit of FIG. 1.

One of the problems with increasing the filter order in the way shown in FIG. 3 is that instability results from the phase shifts across each stage of the filter means combining so that the negative feedback along path 6 becomes positive feedback. One of the ways this is avoided is by the inclusion of the zeroth order term which dominates at low and high frequencies and holds the phase shift down at those frequencies. An effect equivalent to the zeroth order step shown in FIG. 2 is, however, achieved by feeding back the output digital signal, reconverted to analogue form in DAC23 to be summed at the summing nodes 21, 22 in non-inverting and inverting form. The DAC23 consists of a long-tailed pair 24 having a current generator $I_{DAC2}$, the bases of the transistors being driven by inverting outputs of a DQ flip-flop clocked by the same clock as for the DQ flip-flop 16. The flip-flop 25 provides a one sample delay, the input being transferred from the D input to the Q and Q outputs on each clock pulse.

Stability is also promoted, in addition to providing the component via DAC23 equivalent to the zeroth order response, by combining the four orders of the filter response in suitable proportions. Thus, the first order component, is made to dominate, with the proportions of the other orders being less in order that the overall filter region gives a stable closed loop configuration.

Figure 5:
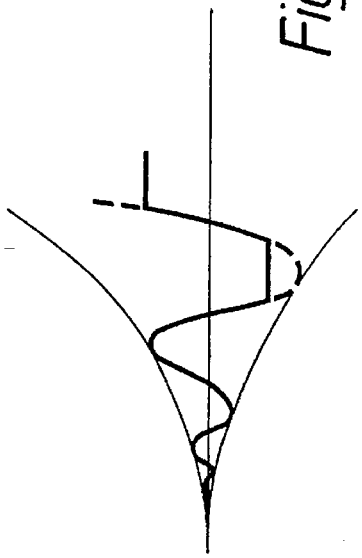
FIG. 5 shows the limited output of the third order filter stage in response to a pulse input.

In accordance with another feature of the invention and also for the purposes of overload recovery performance, a limiter 26 is inserted in the inverting current output of the buffer amplifier 12 in order to limit the maximum oscillation which is fed to the quantising means 13, and a limiter 26a is inserted in the non-inverting current output of the buffer amplifier 17 for the same reason. The limited amplitude of the outputs referred to are illustrated in FIG. 5.

Thus, if the analogue input becomes too large, the feedback pulses from the digital-to-analogue converter 3 will be too small to match the input of the adders 2a, 2b, and oscillation will result. If the limiters were not provided, the converter could fail to recover when the input again fell within acceptable limits because the response of the third and fourth orders would swamp the zeroth, first and second order responses. The limiters prevent this happening and so recovery is promoted.

The five components summed at the summing nodes 21, 22 produce corresponding voltages across resistors R1 and R2 to provide voltage inputs for the quantiser 13.

As noted in our co-pending UK patent application Ser. No. 2256331, and its U.S. counterpart, U.S. Pat. No. 5,392, 039, advantages flow from avoiding resistors in series with the resonant circuit stages of the filter means, viz., the input and output capacitances of the buffer amplifiers degrade the Q of the resonant circuits, since some energy is exchanged between the input and output capacitances and the inductances via the series resistors so that energy is dissipated in the resistors. The absence of the series resistors permits a higher Q to be achieved.

The quantiser 13 may be single-bit, but could have more bits if desired. Typical values for the sampling rate and the resonant frequency of the four filter stages, together with the passband of the converter are as follows: sampling rate of clocks 16a, 20, 10.0 MHz; resonant frequency of filter stages, approximately 2.5 MHz, tuned to give a passband of 100 KHz.

Of course variations may be made without departing from the scope of the invention. Thus, limiters could also be employed in the inverting output of buffer amplifier 11 and, possibly, buffer amplifier 10. While described as a fourth order system, the converter could have as few as two, or three, or more than four orders. Equally, while the resonant circuits shown are bandpass, they could be replaced by integrators (acting as low pass filters) in the case of a baseband converter. Also, while the quantiser 13 is single-bit, a multi-bit quantiser could be provided if desired, and then digital-to-analogue converters 3 and 23 would then also have to be multi-bit.

Further, suitable low or high pass filters could be incorporated in the buffer amplifiers 10–12, 17, to compensate for phase leads or lags imparted by these data buffers. Thus, there is a phase slope associated with each of the buffer amplifiers, so that the phase shift imparted by each buffer amplifier is dependent on the frequency of the signal at the input of each amplifier. If the output of the buffer amplifiers lags the input for a particular signal frequency, the first order response of the filter means will be subject to that phase delay due to the buffer amplifier 10. The second order response will however be subject to an additional phase delay due to buffer amplifier 11 etc. Thus, the desired relationship between the filter orders at summing node 22 will be impaired.

To compensate for this, each buffer amplifier (this is only illustrated for buffer amplifier 12) is provided with a high pass filter 32, which reduces the group delay imparted by the buffer amplifier, which is implemented by a long tailed pair 30, 31. The high pass filter C5, R5, in parallel with resistor R4, is connected between the emitters of the transistors 30, 31.

If desired, the high pass filter 32 could be replaced with a low pass filter 33 shown in FIG. 3b: this would instead add a phase delay to compensate for phase lead introduced by the buffer amplifier.

Figure 4:
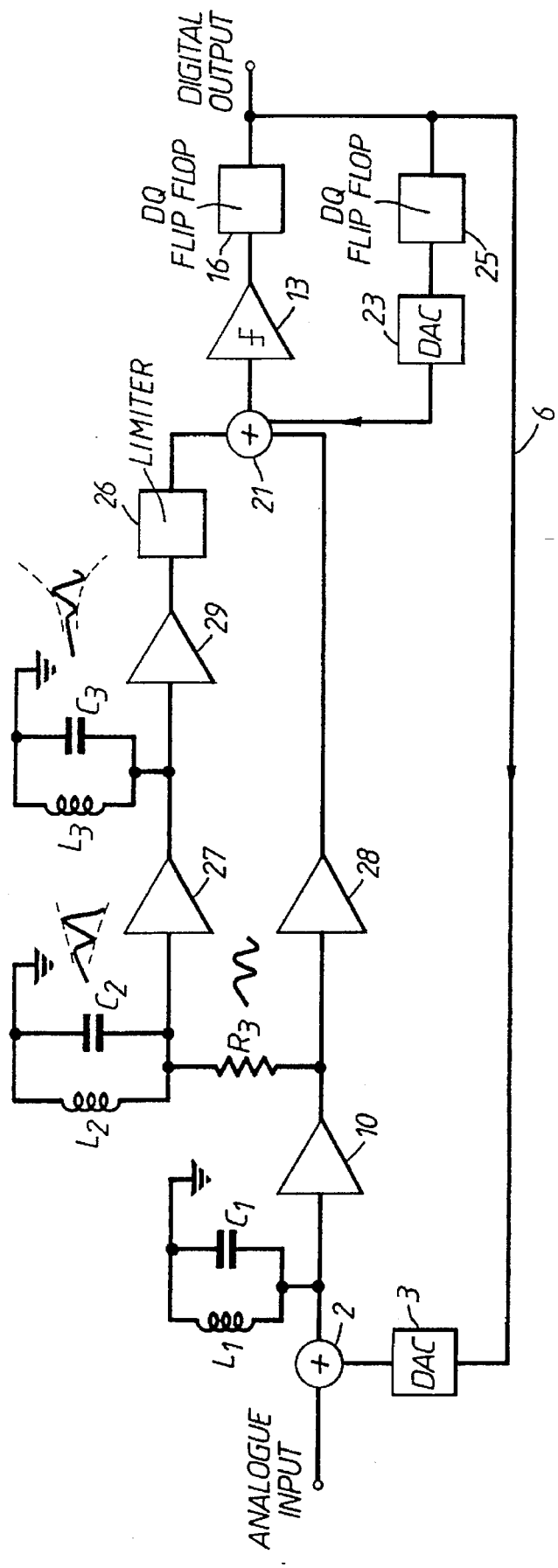
FIG. 4 is a schematic circuit diagram of a third order analogue-to-digital converter.

In a second embodiment of the invention shown in FIG. 4, the filter means of the sigma-delta converter has only three stages. The voltage to current converter buffer amplifiers 10, 27, 28, 29 each have a single output.

The first order response of the filter means is a current at the output of buffer amplifier 10.

This embodiment differs from that of FIG. 3 in that the second stage of the filter has a series resistance R3. The purpose of the resistor is to simplify the addition of the first and second orders of the filter response. Thus, the voltage-to-current converter buffer 28 automatically sums in its output the first and second order responses of the filter. This is because the first order response appearing as a current at the output of the buffer amplifier 10 appears in its first order form across the resistor R3 and in its second order form across the resonant circuit L2, C2.

The third order response is developed as a voltage across the resonant circuit L3, C3 by virtue of current in the output of current-to-voltage converter buffer amplifier 27 which excites L3, C3 producing the third order response. Voltage-to-current converter buffer amplifier 29 produces a current which is limited by limiter 26 as for the embodiment of FIG. 3, and the three orders are together added at adder 21, together with a zeroth order term (as in FIG. 3) from digital-to-analogue converter 23, before being received at quantising means 13 as hitherto for the first embodiment of the invention.

The provision of the series resistor R3 avoids the need for buffer amplifiers with inverting and non-inverting outputs, while still combining three filter orders as before.

Typical figures for resonant frequency, sampling rate and operating frequency are the some as for the embodiment of FIG. 3.

Variations may be made without departing from the scope of the invention. Thus, the bandpass filter stages could be replaced by integrators to provide a baseband implementation, and the quantiser 13 could be multi-bit instead of single bit if desired, and filters could be incorporated into the buffer amplifiers as for the first embodiment.

As is conventional, the sigma-delta converters described may be followed with digital filters to remove out of band quantising noise and to reduce the sampling rate e.g. in a decimation filter.

I claim:

1. An analogue-to-digital converter, comprising: an input for analogue signals, quantizing means for producing a digital output, a feedback loop for feeding a signal derived from the digital output to be combined in analogue form with the analogue input for input to a filter means, the filtered signal being fed to the quantizing means, the filter means comprising at least three filter stages, the filtered signal being derived using the output of at least one stage, other than the first, which is representative only of the response of the corresponding filter order and not of other filter orders, the output of the third stage being representative only of a third order response, and there is provided a limiter in the output of the third stage of the filter.

2. An analogue to digital converter as claimed in claim 1, including a buffer amplifier between two filter stages which buffer amplifier incorporates low or high pass filtering to reduce the phase slope imparted by the buffer amplifier.

3. An analogue-to-digital converter as claimed in claim 1, in which there are four filter stages, and the output of the fourth stage is representative only of a fourth order response, and there is provided a limiter (26a) in the output of the fourth order stage of the filter.

4. An analog-to-digital converter, comprising:

an input for analog signals;

quantizing means for producing a digital output;

a feedback loop coupled to the digital output and including means for converting the digital output to an analog feedback signal;

means for summing the analog signals at the input with the analog feedback signal to form a combined analog signal;

filter means receiving the combined analog signal, the filter means including at least first, second and third filter stages, the filter stages having outputs corresponding to different order responses, wherein the third stage has an output that is representative only of a third order response and the filter means includes a limiter connected to the output of the third stage; and means for summing the outputs of the filter stages to produce a filtered signal that is fed to the quantizing means.

5. The converter as claimed in claim 4, further including a buffer amplifier between two of the filter stages, the buffer amplifier incorporating one of low and high pass filtering to reduce a phase slope imparted by the buffer amplifier.

6. The converter as claimed in claim 4, wherein the filter means further includes a fourth filter stage having an output corresponding only to a fourth order response; and a limiter connected to the output of the fourth filter stage.

* * * * *